US011805700B2

(12) United States Patent
Shibata et al.

(10) Patent No.: US 11,805,700 B2
(45) Date of Patent: Oct. 31, 2023

(54) LAMINATED SUBSTRATE HAVING PIEZOELECTRIC FILM, ELEMENT HAVING PIEZOELECTRIC FILM AND METHOD FOR MANUFACTURING THIS LAMINATED SUBSTRATE

(71) Applicant: SUMITOMO CHEMICAL COMPANY, LIMITED, Tokyo (JP)

(72) Inventors: Kenji Shibata, Hitachi (JP); Kazutoshi Watanabe, Hitachi (JP); Fumimasa Horikiri, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 780 days.

(21) Appl. No.: 16/619,871

(22) PCT Filed: Apr. 19, 2018

(86) PCT No.: PCT/JP2018/016129
§ 371 (c)(1),
(2) Date: Feb. 27, 2020

(87) PCT Pub. No.: WO2018/225396
PCT Pub. Date: Dec. 13, 2018

(65) Prior Publication Data
US 2020/0388746 A1    Dec. 10, 2020

(30) Foreign Application Priority Data

Jun. 9, 2017    (JP) .................................. 2017-114028

(51) Int. Cl.
*H01L 41/047*        (2006.01)
*H01L 41/187*        (2006.01)
(Continued)

(52) U.S. Cl.
CPC ........... *H10N 30/878* (2023.02); *H10N 30/06* (2023.02); *H10N 30/076* (2023.02); *H10N 30/8542* (2023.02)

(58) Field of Classification Search
CPC . H01L 41/1873; H01L 41/0478; H01L 41/29; H01L 41/0471; H10N 30/1051;
(Continued)

(56) References Cited

U.S. PATENT DOCUMENTS

2007/0126313 A1\* 6/2007 Ueno ...................... H01L 41/18
310/311
2009/0236944 A1    9/2009 Shibata et al.
(Continued)

FOREIGN PATENT DOCUMENTS

JP    2007-042231    \*    6/2007    ............. H01L 41/08
JP    2007-142261    \*    6/2007    ............. H01L 41/08
(Continued)

OTHER PUBLICATIONS

Extended European Search Report dated Jan. 25, 2021 for corresponding European Patent Application No. 18814474.5.
(Continued)

*Primary Examiner* — John A Bodnar
(74) *Attorney, Agent, or Firm* — Foley & Lardner LLP

(57) ABSTRACT

There is provided a laminated substrate having a piezoelectric film, including: a substrate; a first electrode film provided on the substrate; and a piezoelectric film provided on the first electrode film, wherein an oxide film containing an oxide represented by a composition formula of $RuO_x$ or $IrO_x$, is provided on the piezoelectric film.

12 Claims, 4 Drawing Sheets

(51) Int. Cl.
   *H01L 41/29* (2013.01)
   *H01L 41/316* (2013.01)
   *H10N 30/87* (2023.01)
   *H10N 30/06* (2023.01)
   *H10N 30/076* (2023.01)
   *H10N 30/853* (2023.01)

(58) Field of Classification Search
   CPC ... H10N 30/057; H10N 30/05; H10N 30/0471
   See application file for complete search history.

(56) References Cited

U.S. PATENT DOCUMENTS

| | | |
|---|---|---|
| 2010/0320874 A1 | 12/2010 | Suenaga et al. |
| 2013/0234564 A1 | 9/2013 | Sakashita et al. |
| 2013/0300254 A1 | 11/2013 | Fujii et al. |
| 2013/0328974 A1 | 12/2013 | Tanaka et al. |
| 2014/0111582 A1 | 4/2014 | Ohashi |
| 2014/0265724 A1 | 9/2014 | Aida et al. |
| 2016/0043299 A1 | 2/2016 | Fujimori et al. |
| 2016/0133825 A1* | 5/2016 | Oishi ............ H01L 41/0805 310/357 |
| 2016/0164490 A1* | 6/2016 | Kamijo ............ H03H 9/0509 29/25.35 |
| 2016/0240768 A1* | 8/2016 | Fujii ............ H01L 41/0471 |

FOREIGN PATENT DOCUMENTS

| | | |
|---|---|---|
| JP | 2007-184513 A | 7/2007 |
| JP | 2008-159807 A | 7/2008 |
| JP | 2011-030195 A | 2/2011 |
| JP | 2011-233817 A | 11/2011 |
| JP | 2012-106902 A | 6/2012 |
| JP | 2014-083761 A | 5/2014 |
| JP | 2014-179610 A | 9/2014 |
| WO | WO-2013/114794 A1 | 8/2013 |

OTHER PUBLICATIONS

Kim Y-S et al: "PZT cantilever array integrated with piezoresistor sensor for high speed parallel operation of AFM", Sensors and Actuators A, vol. 103, No. 1-2, Jan. 15, 2003, pp. 122-129, XP004400390.

International Searching Authority, "International Search Report," issued in connection with International Patent Application No. PCT/JP2018/016129, dated Jul. 10, 2018.

International Searching Authority, "Written Opinion," issued in connection with International Patent Application No. PCT/JP2018/016129, dated Jul. 10, 2018.

International Preliminary Report on Patentability dated Dec. 10, 2019 for corresponding Application No. PCT/JP2018/016129.

* cited by examiner

FIG. 5A Pt(100nm)/RuO$_x$(10nm)
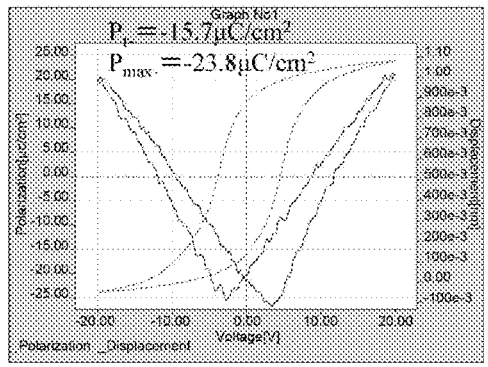
FIG. 5B Pt(100nm)/RuO$_x$(5nm)
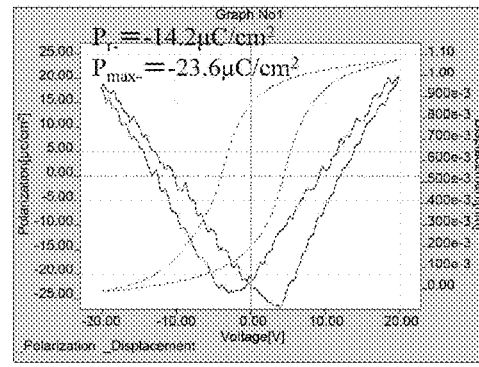
FIG. 5C Pt(100nm)/RuO$_x$(2.5nm)
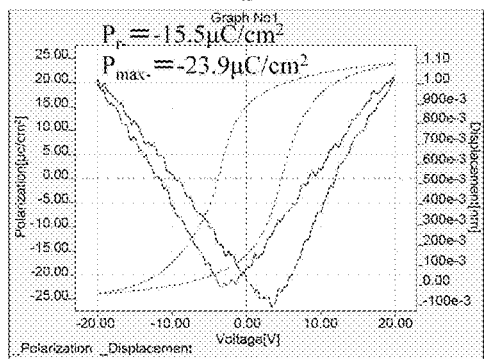
FIG. 5D Pt(100nm)/IrO$_x$(20nm)
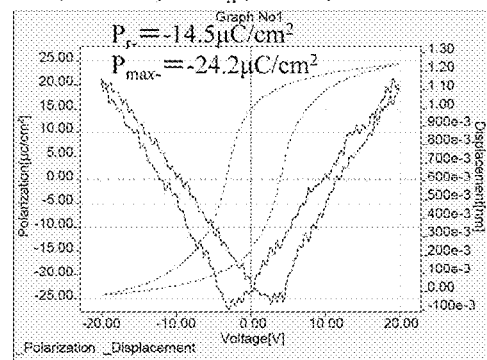
FIG. 5E Pt(100nm)/IrO$_x$(5nm)
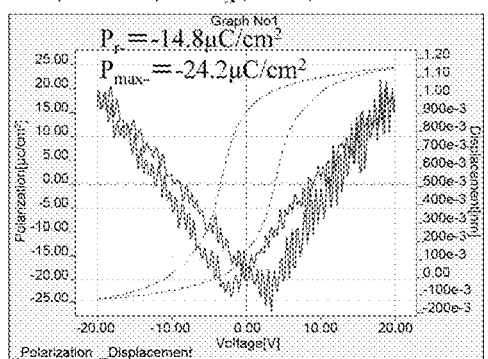
FIG. 5F Pt(100nm)/Ti(2nm) 500°C ANNEALING
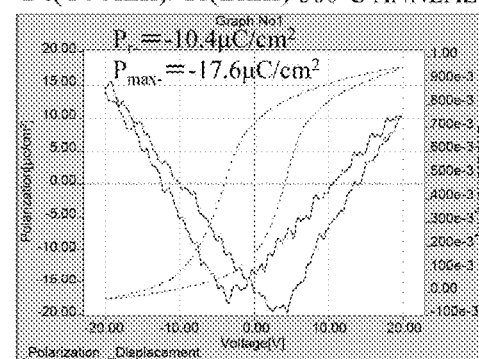

FIG. 6A Pt(100nm)/RuO$_x$(10nm) 700°C ANNEALING
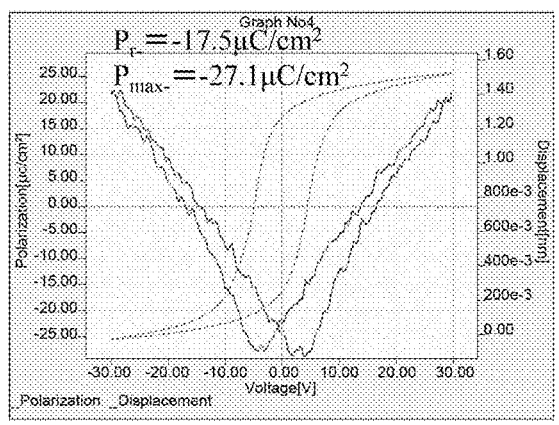
FIG. 6B Pt(100nm)/IrO$_x$(20nm) 500°C ANNEALING
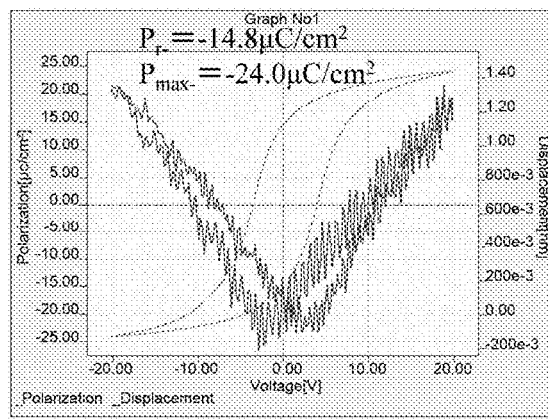

LAMINATED SUBSTRATE HAVING PIEZOELECTRIC FILM, ELEMENT HAVING PIEZOELECTRIC FILM AND METHOD FOR MANUFACTURING THIS LAMINATED SUBSTRATE

CROSS-REFERENCE TO RELATED APPLICATIONS

The present application claims priority under 37 U.S.C. § 371 to International Patent Application No. PCT/JP2018/016129, filed Apr. 19, 2018, which claims priority to and the benefit of Japanese Patent Application No. 2017-114028, filed on Jun. 9, 2017. The contents of these applications are hereby incorporated by reference in their entireties.

TECHNICAL FIELD

The present disclosure relates to a laminated substrate having a piezoelectric film, an element having a piezoelectric film, and a method for manufacturing this laminated substrate.

DESCRIPTION OF RELATED ART

A piezoelectric material is utilized widely for a functional electronic component (device) such as a sensor and an actuator. For example, potassium sodium niobate (KNN) is used as the piezoelectric material (see patent documents 1 and 2, for example). Recently, it is strongly required to provide the piezoelectric material with a longer time to reach dielectric breakdown, namely, with a longer lifetime, when the piezoelectric material is used in devices.

PRIOR ART DOCUMENT

Patent Document

Patent document 1: Japanese Patent Laid Open Publication No. 2007-184513
Patent document 2: Japanese Patent Laid Open Publication No. 2008-159807

SUMMARY

Problem to be Solved by Disclosure

An object of the present disclosure is to provide a laminated substrate having a piezoelectric film with a longer time to reach dielectric breakdown when the laminated substrate is used in devices, and a related technique thereof.

Means for Solving the Problem

According to an aspect of the present disclosure, there is provided a laminated substrate having a piezoelectric film and a related technique thereof, including:
a substrate;
a first electrode film provided on the substrate; and
a piezoelectric film provided on the first electrode film,
wherein an oxide film containing an oxide represented by a composition formula of $RuO_x$ or $IrO_x$, is provided on the piezoelectric film.

Advantage of the Disclosure

According to the present disclosure, there is provided a laminated substrate having a piezoelectric film with a longer time to reach dielectric breakdown when the laminated substrate is used in devices, and a related technique thereof.

BRIEF DESCRIPTION OF THE DRAWINGS

FIG. 5A to FIG. 5F are views showing an evaluation result of a ferroelectricity of a KNN-film, respectively.
FIG. 6A and FIG. 6B are views showing an evaluation result of a ferroelectricity of a KNN-film, respectively.

DETAILED DESCRIPTION OF THE DISCLOSURE

An Embodiment of the Present Disclosure

An embodiment of the present disclosure will be described hereafter, with reference to drawings.

(1) A Constitution of a Laminated Substrate

Figure 1:
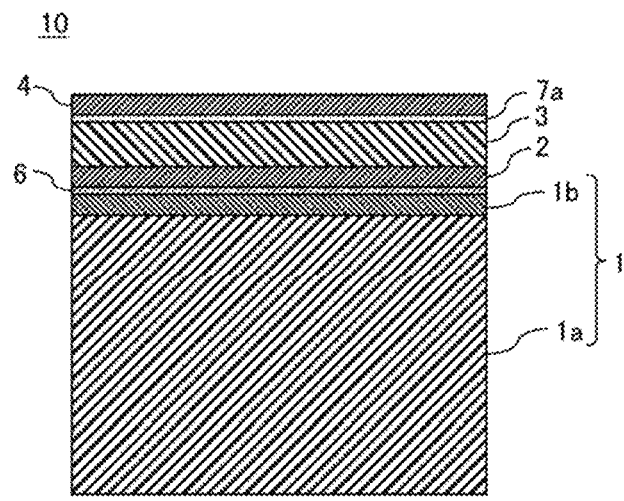
FIG. 1 is a view showing an example of a cross-sectional structure of a laminated substrate 10 according to an embodiment of the present disclosure.

As shown in FIG. 1, a laminated substrate 10 of the present embodiment is constituted as a laminate including a substrate 1, a bottom electrode film 2 as a first electrode film provided on the substrate 1, a piezoelectric film (piezoelectric thin film) 3 provided on the bottom electrode film 2, and a top electrode film 4 as a second electrode film provided on the piezoelectric film 3 interposing an adhesion layer.

Figure 2:
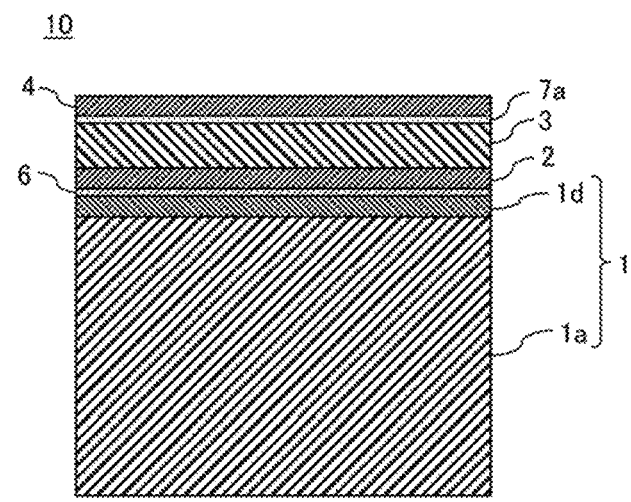
FIG. 2 is a view showing a modified example of the cross-sectional structure of the laminated substrate 10 according to an embodiment of the present disclosure.

As the substrate 1, a single-crystal silicon (Si) substrate 1a on which a surface oxide film ($SiO_2$-film) 1b such as a thermal oxide film or a CVD (Chemical Vapor Deposition) oxide film is provided (formed), namely, a Si-substrate having the surface oxide film, can be used preferably. Further, as shown in FIG. 2, a Si-substrate 1a having an insulating film 1d provided on its surface may also be used as the substrate 1, the insulating film 1d containing an insulating material other than $SiO_2$. Further, a Si-substrate 1a in which Si-(100) plane or Si-(111) plane, etc., is exposed on a surface thereof, namely, a Si-substrate not having the surface oxide film 1b or the insulating film 1d may also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, a metal substrate containing a metal material such as stainless steel may also be used as the substrate 1. The single-crystal Si-substrate 1a has a thickness of 300 to 1000 µm for example, and the surface oxide film 1b has a thickness of 5 to 3000 nm for example.

The bottom electrode film 2 can be formed (provided, deposited) using platinum (Pt) for example. The bottom electrode film 2 is a single-crystal film or a poly-crystal film (they are also referred to as Pt-film hereafter). Preferably, crystals constituting the Pt-film are preferentially oriented in (111) plane direction with respect to a surface of the substrate 1. Namely, it is preferable that a surface of the Pt-film (a surface which is a base of the piezoelectric film 3) is mainly constituted of Pt-(111) plane. The Pt-film can be formed using a method such as a sputtering method, or an evaporation method. In addition to Pt, the bottom electrode film 2 may also be formed using various metals such as gold (Au), ruthenium (Ru), or iridium (Ir), an alloy mainly composed of the above various metals, or a metallic oxide such as strontium ruthenate ($SrRuO_3$) or lanthanum nickel oxide ($LaNiO_3$), etc. An adhesion layer 6 mainly composed of titanium (Ti), tantalum (Ta), titanium oxide ($TiO_2$), or nickel (Ni), etc., for example is formed between the substrate 1 and the bottom electrode film 2 in order to enhance an adhesion between them. The adhesion layer 6 can be formed using a method such as a sputtering method, or an evaporation method. The bottom electrode film 2 has a thickness of 100 to 400 nm for example, and the adhesion layer 6 has a thickness of 1 to 200 nm for example.

The piezoelectric film 3 can be formed (provided, deposited) using alkali niobium oxide which contains for example, potassium (K), sodium (Na), and niobium (Nb), and which is represented by a composition formula of $(K_{1-y}Na_y)NbO_3$. Namely, the piezoelectric film 3 can be formed using potassium sodium niobate (KNN). A coefficient y [=Na/(K+Na)] in the above composition formula is a value in a range of $0<y<1$, preferably $0.4 \leq y \leq 0.7$. The piezoelectric film 3 is a poly-crystal film of KNN (also referred to as KNN-film 3 hereafter). A crystal structure of KNN is a perovskite structure.

Preferably, crystals constituting the KNN-film 3 are preferentially oriented in (001) plane direction with respect to the surface of the substrate 1. Namely, it is preferable that a surface of the KNN-film 3 (a surface which is a base of a $RuO_x$-film 7a described later) is mainly constituted of KNN-(001) plane. By forming the KNN-film 3 directly on the Pt-film (bottom electrode film 2) preferentially oriented in (111) plane direction with respect to the surface of the substrate 1, crystals constituting the KNN-film 3 can be easily preferentially oriented in (001) plane direction with respect to the surface of the substrate 1. For example, crystals of 80% or more of a crystal group constituting the KNN-film 3 can be oriented in (001) plane direction with respect to the surface of the substrate 1, and thereby a region of 80% or more of the surface of the KNN-film 3 can be KNN-(001) plane.

The KNN-film 3 can be formed using a method such as a sputtering method, a PLD (Pulsed Laser Deposition) method, or a sol-gel method. The KNN-film 3 has a thickness of 0.5 to 5 µm for example. A composition ratio of the KNN-film 3 can be adjusted by controlling a composition of a target material used during sputtering, for example. The target material can be produced by mixing and firing $K_2CO_3$-powder, $Na_2CO_3$-powder, $Nb_2O_5$-powder, etc., for example. In this case, the composition of the target material can be controlled by adjusting a mixed ratio of $K_2CO_3$-powder, $Na_2CO_3$-powder, $Nb_2O_5$-powder, etc.

The KNN-film 3 may contain an element such as copper (Cu), manganese (Mn), lithium (Li), Ta, antimony (Sb) other than K, Na, Nb in a range of 5 at % or less.

The top electrode film 4 can be formed (provided, deposited) using various metals such as Pt, Au, aluminum (Al), or Cu, or an alloy of these various metals, for example. The top electrode film 4 can be formed using a method such as a sputtering method, an evaporation method, a plating method, and a metal paste method. The top electrode film 4 does not greatly affect the crystal structure of the KNN-film 3 unlike the bottom electrode film 2. Therefore, a material and a crystal structure of the top electrode film 4, and a method for forming the top electrode film 4 are not particularly limited. The top electrode film 4 has a thickness of 100 to 5000 nm for example.

Figure 3:
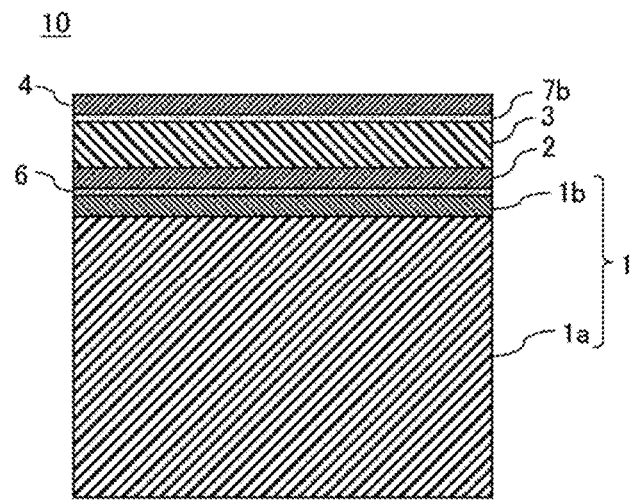
FIG. 3 is a view showing a modified example of the cross-sectional structure of the laminated substrate 10 according to an embodiment of the present disclosure.

A film (oxide film) 7a containing an oxide represented by a composition formula of $RuO_x$ (also referred to as $RuO_x$-film 7a hereafter) is formed (provided, deposited) between the KNN-film 3 and the top electrode film 4, namely, on the KNN-film 3, as an adhesion layer for enhancing an adhesion between them. Further, as shown in FIG. 3, a film 7b containing an oxide represented by a composition formula of $IrO_x$ (also referred to as $IrO_x$-film 7b hereafter) may be formed (provided, deposited) as this adhesion layer.

The $RuO_x$-film 7a can be formed using a method such as a sputtering method, a chemical vapor deposition (CVD) method, an evaporation method. The $RuO_x$-film 7a does not greatly affect the crystal structure of the KNN-film 3 unlike the bottom electrode film 2. Therefore, a crystal structure of the $RuO_x$-film 7a, and a method for forming the $RuO_x$-film 7a are not particularly limited. A composition ratio of the $RuO_x$-film 7a, namely, a value of a coefficient x in the above composition formula can be adjusted by controlling an atmosphere gas during sputtering, for example, $O_2$-gas ratio in a mixed gas of argon (Ar) gas and oxygen ($O_2$) gas ($Ar/O_2$-mixed gas), etc. The value of the coefficient x tends to increase as the above $O_2$-gas ratio increases, and the value of the coefficient x tends to decrease as the above $O_2$-gas ratio decreases. Further, a target material formed by a metal material of ruthenium (Ru) is preferably used as the target material used during sputtering, when forming the $RuO_x$-film 7a in which the coefficient x is in a range of $0<x<2$. A target material produced by firing $RuO_2$-powder, etc., is preferably used, when forming the $RuO_x$-film 7a in which the coefficient x is in a range of $2 \leq x$, preferably $2<x$. The $RuO_x$-film 7a has a thickness of 2 to 30 nm for example, preferably 5 to 30 nm. These points are similarly applied to the $IrO_x$-film 7b. Here, a target material formed by a metal material of iridium (Ir) is preferably used, when forming the $IrO_x$-film 7b in which the coefficient x is in a range of $0<x<2$. A target material produced by firing $IrO_2$-powder, etc., is preferably used, when forming the $IrO_x$-film 7b in which the coefficient x is in a range of $2 \leq x$, preferably $2<x$.

(2) A Constitution of a Piezoelectric Film Device

Figure 4:
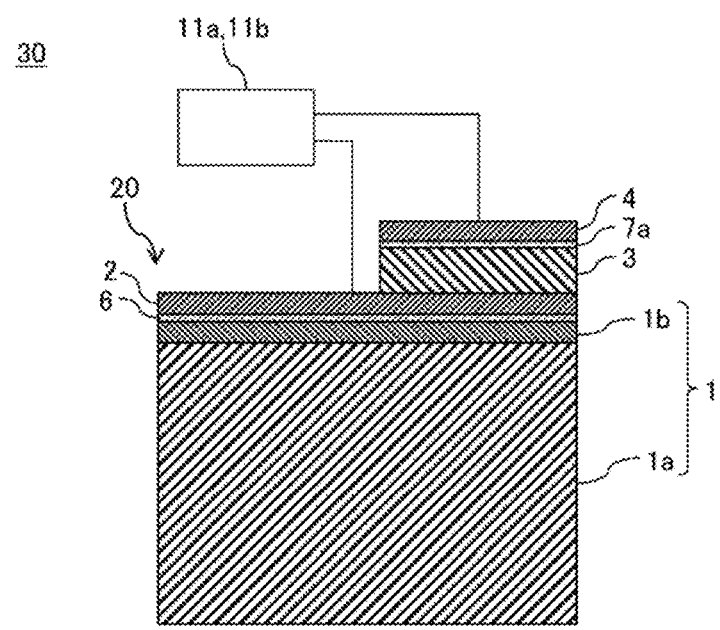
FIG. 4 is a schematic constitution view of a piezoelectric film device 30 according to an embodiment of the present disclosure.

FIG. 4 shows a schematic constitution view of a device 30 having the piezoelectric film of the present embodiment (also referred to as piezoelectric film device 30 hereafter). The piezoelectric film device 30 is constituted including at least an element 20 having the piezoelectric film (also referred to as piezoelectric film element 20 hereafter) obtained by forming the above laminated substrate 10 into a prescribed shape, and a voltage detection means 11a or a voltage application means 11b connected to the piezoelectric film element 20.

By connecting the voltage detection means 11a between the bottom electrode film 2 and the top electrode film 4 of the piezoelectric film element 20, the piezoelectric film device 30 can function as a sensor. When the KNN-film 3 is deformed according to a variation of some physical quantity, a voltage is generated between the bottom electrode film 2 and the top electrode film 4 due to the deformation. By detecting this voltage using the voltage detection means 11a, the physical quantity applied to the KNN-film 3 can be measured. In this case, the piezoelectric film device 30 can be applied to an angular velocity sensor, an ultrasonic sensor, a pressure sensor, and an acceleration sensor, etc., for example.

By connecting the voltage application means 11b between the bottom electrode film 2 and the top electrode film 4 of the piezoelectric film element 20, the piezoelectric film device 30 can function as an actuator. By applying a voltage between the bottom electrode film 2 and the top electrode film 4 using the voltage application means 11b, the KNN-film 3 can be deformed. Various members connected to the piezoelectric film device 30 can be actuated due to the above deformation motion. In this case, the piezoelectric film device 30 can be applied to a head for an inkjet printer, a MEMS mirror for a scanner, and a vibrator for an ultrasonic generator, etc., for example.

(3) A Method for Manufacturing a Laminated Substrate, a Piezoelectric Film Element, and a Piezoelectric Film Device Next, a method for manufacturing the above laminated substrate 10 will be described. First, the bottom electrode film 2 is formed on any one of main surfaces of the substrate 1. It is also acceptable to prepare the substrate 1 on which the bottom electrode film 2 is formed in advance on any one of its main surfaces. Next, the KNN-film 3 is formed on the bottom electrode film 2 using the sputtering method for example. Thereafter, annealing (heat treatment) is performed to the KNN-film 3 (laminate having the KNN-film 3) for a prescribed time (for example 2 hours) under a condition of a prescribed temperature (for example 500° C.). Then, the $RuO_x$-film 7a or the $IrO_x$-film 7b is formed on the KNN-film 3 using the sputtering method for example. Then, the top electrode film 4 is formed on the $RuO_x$-film 7a or the $IrO_x$-film 7b, and therefore the laminated substrate 10 is obtained.

Annealing may be performed to the laminated substrate 10 after forming the $RuO_x$-film 7a or the $IrO_x$-film 7b, and the top electrode film 4.

Conditions for annealing performed to the above laminated substrate 10 are as follows, for example.

Annealing temperature (temperature of the laminated substrate 10): 600° C. or more, preferably 600° C. or more and 800° C. or less, more preferably 700° C.

Annealing time: 0.5 to 12 hours, preferably 1 to 6 hours, more preferably 2 to 3 hours Annealing atmosphere: an atmospheric air or an oxygen atmosphere However, this annealing may not be performed.

Then, this laminated substrate 10 is formed into the prescribed shape, and therefore the piezoelectric film element 20 is obtained. Further, the voltage detection means 11a or the voltage application means 11b is connected to the piezoelectric film element 20, and therefore the piezoelectric film device 30 is obtained.

(4) Effect Obtained by the Present Embodiment

According to the present embodiment, one or more of the following effects can be obtained.

(a) Since the $RuO_x$-film 7a or the $IrO_x$-film 7b is formed between the KNN-film 3 and the top electrode film 4, the time to reach dielectric breakdown of the KNN-film 3 can be long, namely, a longer lifetime of the KNN-film 3 can be obtained, in the piezoelectric film device 30 produced using the laminated substrate 10 of the present embodiment. For example, when Highly Accelerated Life Test (abbreviation: HALT) is performed, 3300 seconds or more can be required from start of applying an electric field to reach dielectric breakdown of the KNN-film 3, HALT being the test of applying an electric field of −300 kV/cm (voltage of −60 V) between the bottom electrode film 2 and the top electrode film 4 in a state of heating the laminated substrate 10 so that a temperature thereof is 200° C. In the present embodiment, when a leakage current density flowing through the KNN-film 3 exceeds 30 mA/cm², the KNN-film 3 is considered to reach dielectric breakdown.

Particularly, further longer lifetime of the KNN-film 3 can be obtained when forming the $RuO_x$-film 7a than when forming the $IrO_x$-film 7b. For example, HALT shows that the lifetime of the KNN-film 3 can be 7600 seconds or more.

In contrast to the method of the above present embodiment, the following method is also conceivable: a film (Ti-film) containing titanium (Ti) or a film ($TiO_x$-film) containing an oxide represented by a composition formula of $TiO_x$ is formed between the KNN-film and the top electrode film. However, the above HALT shows that in a piezoelectric film device produced by processing the laminated substrate obtained by this method, the lifetime of the KNN-film becomes shorter than that of the piezoelectric film device 30 of the present embodiment. Probably this is because Ti diffuses (moves) in the KNN-film due to some factors, thereby adversely affecting the lifetime of the KNN-film due to Ti.

(b) The piezoelectric film device 30 produced using the laminated substrate 10 of the present embodiment has a more excellent ferroelectricity than that of a conventional piezoelectric film device. For example, when an electric field is applied to the KNN-film 3, an absolute value of a saturation polarization ($P_{max-}$) is 23 µC/cm² or more ($|P_{max-}| \geq 23$ µC/cm²), and an absolute value of a residual polarization ($P_{r-}$) is 14 µC/cm² or more ($|P_{r-}| \geq 14$ µC/cm²). Note that the saturation polarization is a polarization when the polarization does not increase even when the electric field is continuously applied, and the residual polarization is a polarization when the applied electric field is returned to zero after reaching the saturation polarization.

(c) Since the $RuO_x$-film 7a or the $IrO_x$-film 7b is formed between the KNN-film 3 and the top electrode film 4, the ferroelectricity of the KNN-film 3 can be high. In contrast, it is confirmed by the present inventors that the ferroelectricity of the above conventional piezoelectric film device produced by processing the laminated substrate having the Ti-film or the $TiO_x$-film becomes lower than that of the the piezoelectric film device of the present embodiment.

(d) Since the thickness of the $RuO_x$-film 7a is 2 to 30 nm, preferably 5 to 30 nm, the above effect of increasing the lifetime and the above effect of obtaining high ferroelectricity can be achieved, and a deterioration of a performance of the piezoelectric film device 30 can be suppressed. The same can be applied to the 7b.

When the thickness of the $RuO_x$-film 7a is less than 2 nm, an in-plane thickness of the $RuO_x$-film 7a is uneven, or the $RuO_x$-film 7a is a discontinuous film, in some cases. Therefore, the above effect of increasing the lifetime or the above effect of obtaining high ferroelectricity is not sufficiently achieved, in some cases. Since the thickness of the $RuO_x$-film 7a is 2 nm or more, these problems can be solved, and therefore the above effect of increasing the lifetime and the above effect of obtaining high ferroelectricity can be achieved. Since the thickness of the $RuO_x$-film 7a is 5 nm or more, the above problems can be reliably solved, and therefore the above effect of increasing the lifetime and the above effect of obtaining high ferroelectricity can be reliably achieved.

The above HALT shows that the lifetime of the KNN-film 3 is less than 3300 seconds in some cases, when the thickness of the RuO$_x$-film 7a is more than 30 nm. Further, when the RuO$_x$-film 7a becomes thick, a film stress of the RuO$_x$-film 7a itself becomes large, and therefore the RuO$_x$-film 7a is easily peeled off. Furthermore, since Ru or Ir is a hard metal material, the RuO$_x$-film 7a containing Ru or the IrO$_x$-film 7b containing Ir becomes a hard film. When such a hard RuO$_x$-film 7a becomes thick, a vibration part including the KNN-film 3 hardly vibrates (resonates), thereby causing a deterioration of a sensitivity when the laminated substrate 10 is applied to the sensor, or causing an increase of a power consumption when it is applied to the actuator, in some cases. As a result of these reasons, it is preferable that the thickness of the RuO$_x$-film 7a is 30 nm or less.

(e) It is preferable to form a film represented by the composition formula of RuO$_x$ (0<x<2) as the RuO$_x$-film 7a, in terms of suppressing a decrease of a deposition rate of the RuO$_x$-film 7a.

As described above, the value of the coefficient x tends to increase as the above O$_2$-gas ratio in the atmosphere gas (Ar/O$_2$-mixed gas) during sputtering the RuO$_x$-film 7a increases, and the value of the coefficient x tends to decrease as the above O$_2$-gas ratio decreases. However, Ru-atoms are knocked out from the sputtering target material by Ar-gas (ionized Ar-atoms (Ar$^+$)). Therefore, when the above O$_2$-gas ratio increases, namely, when an Ar-gas ratio decreases, an amount (amount per unit time) of Ru-atoms knocked out from the target decreases, and therefore the deposition rate of the RuO$_x$-film 7a is decreased. By setting the O$_2$-gas ratio to 50% or less for example, a practical deposition rate can be obtained, and in this case, the value of the coefficient x becomes less than 2.

(f) It is preferable to form a film represented by the composition formula of RuO$_x$ (2<x) as the RuO$_x$-film 7a, in terms of reliably obtaining a long lifetime of the KNN-film 3.

Since the film represented by the composition formula of RuO$_x$ (2<x) is formed, a quantity of oxygen (O) diffusing from the RuO$_x$-film 7a into the KNN-film 3 can be increased. Thereby, an oxygen deficiency (oxygen vacancy) in the KNN-film 3 can be filled with oxygen diffused from the RuO$_x$-film 7a, the oxygen deficiency being a factor of reaching dielectric breakdown of the KNN-film 3. As a result, the longer lifetime of the KNN-film 3 can be reliably obtained. The "oxygen vacancy" called here means an oxygen deficiency place generated in the crystals constituting the KNN-film 3, by annealing after forming the KNN-film 3, for example.

(g) The laminated substrate 10 is subjected to annealing under a temperature condition of 600° C. or more after forming the RuO$_x$-film 7a and the top electrode film 4, or the laminated substrate 10 is not subjected to annealing after forming the RuO$_x$-film 7a and the top electrode film 4, and thereby the longer lifetime of the KNN-film 3 can be reliably obtained. It is already confirmed by the present inventors that the ferroelectricity of the KNN-film 3 is not affected even when annealing is performed.

In contrast, the following method is also conceivable: the laminated substrate is subjected to annealing under a temperature condition of less than 600° C. (for example 500° C.) after forming the RuO$_x$-film and the top electrode film. However, the lifetime of the KNN-film is shorter when annealing the laminated substrate under the temperature condition of less than 600° C. than when not annealing the laminated substrate after forming the RuO$_x$-film and the top electrode film, or than when annealing the laminated substrate under the temperature condition of 600° C. or more.

(5) Modified Example

The present embodiment is not limited to the abovementioned embodiment, and can be modified as the following modified examples.

Modified Example 1

For example, the RuO$_x$-film 7a or the IrO$_x$-film 7b may be formed between the substrate 1 and the bottom electrode film 2. Namely, the film containing oxide represented by the composition formula of RuO$_x$ or IrO$_x$ may be formed as the adhesion layer 6. Further, for example, the RuO$_x$-film 7a or the IrO$_x$-film 7b may be formed between the bottom electrode film 2 and the KNN-film 3. In these cases, the RuO$_x$-film 7a or the IrO$_x$-film 7b may be formed or may not be formed between the KNN-film 3 and the top electrode film 4. In these cases as well, similar effect as the above embodiment can be obtained.

Modified Example 2

The substrate 1 may be removed from the laminated substrate 10 when forming the above laminated substrate 10 into the piezoelectric film element 20, as long as the piezoelectric film device 30 produced using the laminated substrate 10 (piezoelectric film element 20) is applied to desired applications such as a sensor or an actuator.

Other Embodiment

As described above, explanation has been given specifically for the embodiments of the present disclosure. However, the present disclosure is not limited thereto, and can be variously modified in a range not departing from the gist of the disclosure.

EXAMPLES

Explanation will be given for an experimental result supporting an effect of the above embodiment hereafter.

A Si-substrate with a surface of (100) plane direction, a thickness of 610 μm, a diameter of 6 inches, and having a thermal oxide film (a thickness of 200 nm) formed on its surface, was prepared as a substrate. Then, a laminated substrate was produced by forming a Ti-layer (a thickness of 2 nm) as a first adhesion layer, a Pt-film (preferentially oriented in (111) plane direction with respect to a surface of the substrate and having a thickness of 200 nm) as a bottom electrode film, a KNN-film (preferentially oriented in (001) plane direction with respect to the surface of the substrate and having a thickness of 2 μm) as a piezoelectric film, any one of a RuO$_x$-film, an IrO$_x$-film, a TiO$_x$-film (a thickness of 2 nm), or a Ti-film (a thickness of 2 nm) as a second adhesion layer, and a Pt-film (a thickness of 100 nm) as a top electrode film in this order on the thermal oxide film of the substrate. A thickness of the RuO$_x$-film or the IrO$_x$-film was varied in a range of 2.5 to 30 nm. Further, a laminate having the KNN-film was subjected to annealing under conditions of 2 hours at a temperature of 500° C. after forming the KNN-film and before forming the second adhesion layer. Further, the laminated substrate after forming the top electrode film was not subjected to annealing, or was subjected to annealing under conditions of 2 hours at a temperature of 500° C., 2 hours at a temperature of 600° C., or 2 hours at a temperature of 700° C.

All of the Ti-film, the Pt-film, the KNN-film, the $RuO_x$-film, the $IrO_x$-film, and the $TiO_x$-film were formed using a method of RF magnetron sputtering method.

Processing conditions for forming the Ti-film and the Pt-film were as follows, respectively.
Substrate temperature: 300° C.
RF power: 1200 W
Gas: Ar-gas
Pressure in Ar-gas atmosphere: 0.3 Pa
Deposition time: 5 minutes Processing conditions for forming the KNN-film was as follows.
Substrate temperature: 600° C.
RF power: 2200 W
Gas: $Ar/O_2$-mixed gas
Pressure in $Ar/O_2$-mixed gas atmosphere: 0.3 Pa
Partial pressure of Ar-gas/partial pressure of $O_2$-gas: 25/1
Deposition rate: 1 μm/hr Processing conditions for forming the $RuO_x$-film, the $IrO_x$-film, and the $TiO_x$-film were as follows, respectively.
Substrate temperature: room temperature (25° C.)
RF power: 300 W
Gas: $Ar/O_2$-mixed gas
Pressure in $Ar+O_2$ mixed gas atmosphere: 0.3 Pa
Partial pressure of Ar-gas/partial pressure of $O_2$-gas: 1/1
Deposition rate: 0.1 μm/hr The lifetime and the ferroelectricity of the KNN-film of the laminated substrate were evaluated respectively. Table 1 and table 2 show evaluation results of the lifetime of the KNN-film. FIGS. 5A to 5F, and FIGS. 6A and 6B are views showing an evaluation result of the ferroelectricity of the KNN-film, and shows a hysteresis curve of a voltage—a polarization and a piezoelectric displacement characteristic to an application voltage, respectively.

(Evaluation of a Lifetime)

An evaluation of the lifetime was performed by HALT under a condition described in the above embodiment, in which the time (sec) to reach dielectric breakdown of the KNN-film was measured. Values in table 1 and table 2 are average values of lifetime values measured at 7 portions in 0.5 mm per 1 sample. Further, in table 1 and table 2, the term "no annealing" means that annealing was not performed after forming the top electrode film, and the term "600° C. annealing" means that annealing was performed to the laminated substrate for 2 hours under the temperature condition of 600° C. after forming the top electrode film. This is also applied to "500° C. annealing" and "700° C. annealing" in table 2.

TABLE 1

| | Time to reach dielectric breakdown of KNN-film (sec) | |
|---|---|---|
| | no annealing | 600° C. annealing |
| $TiO_x$-film (2 nm) | 123 | 2343 |
| $RuO_x$-film (5 nm) | 8768 | 7680 |
| $RuO_x$-film (10 nm) | 35833 | 19499 |
| $RuO_x$-film (30 nm) | 37826 | 5870 |
| $IrO_x$-film (10 nm) | 4580 | 3303 |

TABLE 2

| | Time to reach dielectric breakdown of KNN-film (sec) | |
|---|---|---|
| | $RuO_x$-film (10 nm) | $IrO_x$-film (10 nm) |
| no annealing | 25833 | 4580 |
| 500° C. annealing | 3143 | 1413 |
| 600° C. annealing | 19499 | 3303 |
| 700° C. annealing | 22466 | 5301 |

Table 1 shows that the lifetime of the KNN-film is 3300 seconds or more in the laminated substrate in which the $RuO_x$-film or the $IrO_x$-film is formed between the KNN-film and the top electrode film, and meanwhile shows that the lifetime of the KNN-film is less than 3300 seconds in the laminated substrate in which the $TiO_x$-film is formed between the KNN-film and the top electrode film.

Table 1 and table 2 show that a longer lifetime of the KNN-film is obtained in the laminated substrate in which the $RuO_x$-film is formed than in the laminated substrate in which the $IrO_x$-film is formed, when the thickness of the $RuO_x$-film and the thickness of the $IrO_x$-film are the same.

Table 2 shows that the lifetime of the KNN-film is 3300 seconds or more in the laminated substrate in which annealing is not performed after forming the top electrode film, shows that the lifetime of the KNN-film is 3300 seconds or more in the laminated substrate in which 600° C. annealing or 700° C. annealing is performed after forming the top electrode film, and meanwhile shows that the lifetime of the KNN-film is less than 3300 seconds in the laminated substrate in which 500° C. annealing is performed after forming the top electrode film.

Namely, it can be confirmed that the longer lifetime of the KNN-film can be obtained when forming the $RuO_x$-film or the $IrO_x$-film between the KNN-film and the top electrode film than when forming the $TiO_x$-film therebetween. Further, it can be confirmed that further longer lifetime of the KNN-film can be obtained when forming the $RuO_x$-film than when forming the $IrO_x$-film. Furthermore, it can be confirmed that the longer lifetime of the KNN-film can be reliably obtained by not performing annealing after forming the top electrode film, or performing annealing under the temperature condition of 600° C. or more.

(Evaluation of Ferroelectricity)

In an evaluation of the ferroelectricity, a hysteresis curve showing a relation of a voltage and a polarization was obtained by applying an electric field of ±100 kV/cm at a frequency of 1 kHz.

FIGS. 5A to 5E show that $|P_{max\_}| \geq 23$ μC/cm² and $|P_{r\_}| \geq 14$ μC/cm² in the laminated substrate in which the $RuO_x$-film or the $IrO_x$-film is formed between the KNN-film and the top electrode film, and meanwhile FIG. 5F shows that $|P_{max\_}|$ is 17.6 μC/cm², and $|P_{r\_}|$ is 10.4 μC/cm² in the laminated substrate in which the Ti-film is formed between the KNN-film and the top electrode film. Note that the laminated substrates shown in FIGS. 5A to 5E are not subjected to annealing after forming the top electrode film, and the laminated substrate shown in FIG. 5F is subjected to annealing for 2 hours under the temperature condition of 500° C.

FIG. 5A shows that $|P_{max\_}|$ is 23.8 μC/cm², and $|P_{r\_}|$ is 15.7 μC/cm² in the laminated substrate in which the $RuO_x$-film having the thickness of 10 nm is formed as the second adhesion layer, and annealing is not performed after forming the top electrode film. FIG. 6A shows that $|P_{max\_}|$ is 23.8

μC/cm², and |P$_{r-}$| is 17.9 μC/cm² in the laminated substrate in which the RuO$_x$-film having the thickness of 10 nm is formed as the second adhesion layer, and annealing is performed for 2 hours under the temperature condition of 700° C. after forming the top electrode film. FIG. 5D shows that |P$_{max-}$| is 24.2 μC/cm², and |P$_{r-}$| is 14.5 μC/cm² in the laminated substrate in which the IrO$_x$-film having the thickness of 20 nm is formed as the second adhesion layer, and annealing is not performed after forming the top electrode film. Further, FIG. 6B shows that |P$_{max-}$| is 24.0 μC/cm², and |P$_{r-}$| is 14.8 μC/cm² in the laminated substrate in which the IrO$_x$-film having the thickness of 20 nm is formed as the second adhesion layer, and annealing is performed for 2 hours under the temperature condition of 500° C. after forming the top electrode film.

Namely, from a comparison between FIG. 5A and FIG. 6A, and a comparison between FIG. 5D and FIG. 6B, it can be confirmed that even when either of the RuO$_x$-film or IrO$_x$-film is formed as the second adhesion layer, the values of |P$_{max-}$| and |P$_{r-}$| of the laminated substrate in which annealing is performed after forming the top electrode film, are almost the same as the values of |P$_{max-}$| and |P$_{r-}$| of the laminated substrate in which annealing is not performed after forming the top electrode film. Namely, even in any case, it can be confirmed that annealing performed to the laminated substrate after forming the top electrode film is not affected the ferroelectricity of the KNN-film.

<Preferable Aspects of the Present Disclosure>

Preferable aspects of the present disclosure will be supplementary described hereafter.

(Supplementary Description 1)

According to an aspect of the present disclosure, there is provided a laminated substrate having a piezoelectric film, including:
a substrate;
a first electrode film provided on the substrate; and
a piezoelectric film provided on the first electrode film,
wherein an oxide film containing an oxide represented by a composition formula of RuO$_x$ or IrO$_x$, is provided on the piezoelectric film.

(Supplementary Description 2)

Preferably, there is provided the substrate of the supplementary description 1, wherein an oxide film containing an oxide represented by a composition formula of RuO$_x$ or IrO$_x$, is provided at least between the substrate and the first electrode film or between the first electrode film and the piezoelectric film.

(Supplementary Description 3)

Preferably, there is provided the substrate of the supplementary description 1 or 2, wherein the oxide film is a film containing the oxide represented by the composition formula of RuO$_x$.

(Supplementary Description 4)

Preferably, there is provided the substrate of any one of the supplementary descriptions 1 to 3, wherein the oxide film is a film containing an oxide represented by a composition formula of RuO$_x$ (0<x<2).

(Supplementary Description 5)

Preferably, there is provided the substrate of any one of the supplementary descriptions 1 to 3, wherein the oxide film is a film containing an oxide represented by a composition formula of RuO$_x$ (2<x).

(Supplementary Description 6)

Preferably, there is provided the substrate of any one of the supplementary descriptions 1 to 5, wherein the oxide film has a thickness of 2 nm or more and 30 nm or less, preferably 5 nm or more and 30 nm or less.

(Supplementary Description 7)

Preferably, there is provided the substrate of any one of the supplementary descriptions 1 to 6, wherein the piezoelectric film is a film containing an alkali niobium oxide of a perovskite structure represented by a composition formula of $(K_{1-y}Na_y)NbO_3$ (0<y<1).

(Supplementary Description 8)

Preferably, there is provided the substrate of any one of the supplementary descriptions 1 to 7, wherein an absolute value of a saturation polarization (P$_{max-}$) of the piezoelectric film is 23 μC/cm² or more, and an absolute value of a residual polarization (P$_{r-}$) of the piezoelectric film is 14 μC/cm² or more.

(Supplementary Description 9)

Preferably, there is provided the substrate of any one of the supplementary descriptions 1 to 8, wherein the oxide film is not subjected to annealing (heat treatment).

(Supplementary Description 10)

Preferably, there is provided the substrate of any one of the supplementary descriptions 1 to 8, wherein the oxide film is subjected to annealing under a temperature condition of 600° C. or more and 800° C. or less.

(Supplementary Description 11)

According to another aspect of the present disclosure, there is provided a laminated substrate having a piezoelectric film, including:
a substrate;
a first electrode film provided on the substrate; and
a piezoelectric film provided on the first electrode film,
wherein the piezoelectric film is a film containing an alkali niobium oxide of a perovskite structure represented by a composition formula of $(K_{1-y}Na_y)NbO_3$ (0<y<1), and
when a second electrode film is provided on the piezoelectric film, and an electric field of −300 kV/cm (an voltage of −60 V) is applied between the first electrode film and the second electrode film in a state of heating the laminated substrate so that a temperature thereof is 200° C., 3300 seconds or more are required from start of applying the electric field until a leakage current density flowing through the piezoelectric film exceeds 30 mA/cm².

(Supplementary Description 12)

Preferably, there is provided the substrate of the supplementary description 11, wherein an oxide film containing an oxide represented by a composition formula of RuO$_x$ or IrO$_x$, is provided on the piezoelectric film.

(Supplementary Description 13)

According to further another aspect of the present disclosure, there is provided an element having a piezoelectric film or a device having a piezoelectric film, including:
a substrate;
a first electrode film provided on the substrate;
a piezoelectric film provided on the first electrode film; and
a second electrode film provided on the piezoelectric film,
wherein an oxide film containing an oxide represented by a composition formula of RuO$_x$ or IrO$_x$, is provided between the piezoelectric film and the second electrode film.

(Supplementary Description 14)

According to further another aspect of the present disclosure, there is provided a method for manufacturing a laminated substrate having a piezoelectric film, including:
forming an electrode film on a substrate;
forming a piezoelectric film on the electrode film; and
forming an oxide film containing an oxide represented by a composition formula of RuO$_x$ or IrO$_x$ on the piezoelectric film.

(Supplementary Description 15)
Preferably, there is provided the method for the supplementary description 14, wherein after forming the oxide film, the method does not include annealing of the laminated substrate.

(Supplementary Description 16)
Preferably, there is provided the method for the supplementary description 14, wherein after forming the oxide film, the method includes annealing of the laminated substrate under a temperature condition of 600° C. or more, preferably 600° C. or more and 800° C. or less.

DESCRIPTION OF SIGNS AND NUMERALS

1 Substrate
3 Piezoelectric film
7a $RuO_x$-film
7b $IrO_x$-film
10 Laminated substrate

The invention claimed is:

1. A laminated substrate having a piezoelectric film, comprising:
   a substrate;
   a first electrode film on the substrate; and
   a piezoelectric film on the first electrode film,
   an oxide film containing $RuO_x$, the oxide film is on the piezoelectric film in direct contact with the piezoelectric film,
   a second electrode film on the oxide film in direct contact with the oxide film, the second electrode film being made of a material which is different from the material of the oxide film and the second electrode film being an outermost layer of the laminated substrate.

2. The laminated substrate according to claim 1, wherein the oxide film has a thickness of 2 nm or more and 30 nm or less.

3. The laminated substrate according to claim 1, wherein the piezoelectric film is a film containing an alkali niobium oxide of a perovskite structure represented by a composition formula of $(K_{1-y}Na_y)NbO_3$ (0<y<1).

4. The laminated substrate according to claim 1, wherein the piezoelectric film has an absolute value of a saturation polarization ($P_{max\_}$) of 23 μC/cm² or more, and an absolute value of a residual polarization ($P_{r\_}$) of 14 μC/cm² or more.

5. An element having a piezoelectric film, comprising:
   a substrate;
   a first electrode film on the substrate;
   a piezoelectric film on the first electrode film;
   a second electrode film on the piezoelectric film, and
   an oxide film containing $RuO_x$, between the piezoelectric film and the second electrode film, wherein the second electrode film being made of a material which is different from the material of the oxide film, the oxide film being in direct contact with each of the piezoelectric film and the second electrode film, and the second electrode film being an outermost layer of the element.

6. A method of manufacturing a laminated substrate, comprising:
   forming a first electrode film on a substrate;
   forming a piezoelectric film on the first electrode film;
   forming an oxide film containing $RuO_x$ in direct contact the piezoelectric film; and
   forming a second electrode film on the oxide film in direct contact with the oxide film, wherein the second electrode film being formed of a material which is different from the material of the oxide film, and the second electrode film being an outermost layer of the laminated substrate.

7. The laminated substrate according to claim 2, wherein the piezoelectric film is a film containing an alkali niobium oxide of a perovskite structure represented by a composition formula of $(K_{1-y}Na_y)NbO_3$ (0<y<1).

8. The laminated substrate according to claim 2, wherein the piezoelectric film has an absolute value of a saturation polarization ($P_{max\_}$) of 23 μC/cm² or more, and an absolute value of a residual polarization ($P_{r\_}$) of 14 μC/cm² or more.

9. The laminated substrate according to claim 3, wherein the piezoelectric film has an absolute value of a saturation polarization ($P_{max\_}$) of 23 μC/cm² or more, and an absolute value of a residual polarization ($P_{r\_}$) of 14 μC/cm² or more.

10. The laminated substrate according to claim 1, wherein the second electrode film is made of Pt, Au, Al, Cu, or an alloy thereof.

11. The element according to claim 5, wherein the second electrode film is made of Pt, Au, Al, Cu, or an alloy thereof.

12. The method according to claim 6, wherein the second electrode film is formed of Pt, Au, Al, Cu, or an alloy thereof.

* * * * *